United States Patent [19]
Artieri

[11] Patent Number: 5,946,261
[45] Date of Patent: *Aug. 31, 1999

[54] DUAL-PORT MEMORY

[75] Inventor: Alain Artieri, Meylan, France

[73] Assignee: SGS-Thomson Microelectronics S.A., Saint Genis, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/643,735

[22] Filed: May 6, 1996

Related U.S. Application Data

[63] Continuation of application No. 08/273,047, Jul. 8, 1994, abandoned.

[30]   Foreign Application Priority Data

Jul. 12, 1993 [FR]   France ................................. 93-08837

[51] Int. Cl.⁶ ............................................. G11C 7/00
[52] U.S. Cl. ...................... 365/230.05; 365/203; 365/210
[58] Field of Search ............................ 365/189.04, 189.07, 365/189.12, 210, 240, 49, 230.05, 203

[56]   References Cited

U.S. PATENT DOCUMENTS

| | | | |
|---|---|---|---|
| 4,849,935 | 7/1989 | Miyazawa | 365/89.05 |
| 4,864,543 | 9/1989 | Ward et al. | 365/221 |
| 5,245,575 | 9/1993 | Sasaki et al. | 365/189.12 |
| 5,268,869 | 12/1993 | Ferris et al. | 365/210 |
| 5,317,537 | 5/1994 | Shinagawa et al. | 365/210 X |
| 5,424,995 | 6/1995 | Miyazaki et al. | 365/230.05 |

FOREIGN PATENT DOCUMENTS 0 390 453 A2   10/1990   European Pat. Off. .

OTHER PUBLICATIONS

Proceedings of the IEEE 1989 Custom Integrated Circuits Conference, May 15, 1989, San Diego, CA, pp. 23.4.1–23.4.4, Kawauchi, et al., "A 1.0um Compilable FIFO Buffer for Standard Cell".

1990 Symposium on VLSI Circuits Digest of Technical Papers, Jun. 7, 1990, Honolulu, HI, pp. 65–66, Sakaue, et al., "A 0.8um BiCMOS ATM Switch on the 800Mbps asynchronous buffered banyan network".

*Primary Examiner*—Do Hyun Yoo
*Attorney, Agent, or Firm*—Wolf, Greenfield & Sacks, P.C.

[57]   ABSTRACT

A dual-port memory includes a dummy memory cell associated with a dummy output line and with a precharge transistor, the output of the dummy cell being at "0". A dummy read transistor is turned on by the active state of the read selection signal and connects the output of the dummy cell to the dummy output line. Circuitry is provided for turning on the output transistors of the memory when the state of the dummy output line reaches a predetermined switching threshold of an inverter.

7 Claims, 4 Drawing Sheets

DUAL-PORT MEMORY

This application is a continuation of application Ser. No. 08/273,047, filed Jul. 8, 1994, now abandoned.

BACKGROUND OF THE INVENTION

1. Field of the Invention

The present invention relates to dual-port memories, that is, memories including separate inputs and outputs, and more particularly to first-in/first-out (FIFO) memories.

2. Discussion of the Related Art

FIG. 1 partially represents a conventional dual-port memory structure. This memory includes dual-port memory cells 10 disposed in columns. As shown, each cell 10 includes, for example, two head-to-tail connected inverters 10-1. Each inverter includes a pair of complementary output (N and P-channel MOS) transistors. The input and the output of the cell respectively correspond to the input and the output of a first inverter. The second inverter, whose output is connected to the input of the memory cell, includes output transistors that are more resistive than the transistors of the first inverter, so as to limit current consumption during a write cycle in the cell.

With each column of cells is associated an input bit line Bi and an output bit line Bo. The input of each cell 10 of a column is connected to the corresponding input line Bi through an N-channel MOS transistor M1. The output of each cell 10 of a column is connected to the corresponding output line Bo through an N-channel MOS transistor M2. The gates of transistors M1 of a same row of cells are connected to a write line W and the gates of transistors M2 of a same row of cells are connected to a read line R.

Each output line Bo is connected to a high supply voltage Vdd through a P-channel MOS transistor MP1, referred to as a precharge transistor. Each output line Bo is connected to an output Bo1 of the memory through successively an N-channel MOS transistor M3, a latch 12 constituted by head-to-tail connected inverters, and a three-state gate 14.

Transistors MP1 and M3 are controlled by a read-column signal RC. The three-state gates 14 are controlled by an enable signal EN that may be equal to signal RC or fixed by an external device, such as a microprocessor, that reads the memory. The precharge transistors MP1 can also be N-channel transistors; if they are N-channel transistors, they are controlled by the logic complement of signal RC.

In a common conventional configuration, the input lines Bi are directly connected, or through buffers (not shown), to respective lines of an input data bus Di. The outputs Bo1 of the memory are connected to respective lines of an output bus Do. Thus, with n-line data buses Di and Do are associated n-column dual-port memories.

The write lines W and read lines R are controlled by an address decoder (not shown). To write data in the memory, the device controlling the input bus Di presents data on bus Di, issues an address (on an address bus, not shown) that selects one of the rows of the cells, and asserts a write-column line WC (not shown in FIG. 1).

To read data out of the memory, a device that controls the bus Do issues an address that selects one of the rows of the cells, asserts the read-column line RC, and asserts line EN.

Dual-port memories such as the one of FIG. 1 are often used in FIFO memories. A FIFO does not have an address bus. To read in a FIFO, the read-column line RC is asserted and the data that the memory then presents at its output (Bo1) is read. To write in the FIFO, the write-column line WC is asserted and the data to write is presented at its input (Bi).

A FIFO generally includes a dual-port memory such as the one of FIG. 1 with an address decoder, the addresses being provided by a relatively complex control circuit that manages the FIFO mechanism as a function of the write-column signals WC and read-column signals RC provided externally.

FIG. 2 shows the waveform of various signals in the structure of FIG. 1 during successively reading a "0" in a first cell and reading twice a "1" in a second cell. At successive times t1, t2 and t3, it is decided to carry out the above read cycles.

At time t1, the read-column line RC and a line R1 that corresponds to one of the read lines R are asserted. Transistor M2 is turned on and transmits the output of cell 10 to the output line Bo. Transistor MP1 is off and line Bo is not forced to voltage Vdd. The cell 10 that is read contains a "0", which means that the input of the cell is at "0", whereas its output is at "1". Thus, line Bo remains at "1". The transistor M3 is turned on and transmits the state "1" of line Bo to the input of latch 12 that inverses this state. Thus, the output Bo1 and the corresponding line of bus Do, are set to or remain at "0". The lines RC and R1 are disabled before time t2, which causes the precharge transistors MP1 to turn on and the output transistors M3 to be turned off.

At time t2, it is decided to read a "1" in a second memory cell. Line PC is again asserted and a line R2 corresponding to another read line R is asserted. This time, the output of the cell 10 that is read is at "0". Line Bo slowly passes from Vdd to 0 while discharging toward the output of cell 10 through transistor M2, the output of cell 10 being forced to ground by a transistor of the cell. Latch 12 switches only when the state of line Bo reaches a switching threshold Vt at time t2s. Thus, the output Bo1 changes to "1" slightly after time t2. Before time t3, lines RC and R2 are disabled, which causes the output lines Bo to be reset to "1".

At time t3, the same cell as at time t2 is read again. Lines RC and R2 are again asserted. As at time t2, line Bo is progressively discharged from Vdd to 0 through transistor M2 toward the output of the cell that is being read. However, between time t3 and time t3s, when the state of line Bo reaches the threshold voltage Vt, latch 12, whose input was at "0", switches at time t3, and switches again at time t3s. This causes, as shown, an undesired passage through "0" of output Bo1 between times t3 and t3s.

FIG. 2 also shows the waveform $Bi_x$ of an input line of a second dual-port memory whose input would be connected to bus Do. The state of line $Bi_x$ varies in the same manner as the corresponding output Bo1.

As is the case for all CMOS circuits, a memory such as the one of FIG. 1 consumes current only during transitions of its internal signals. Thus, the current consumption of such a memory is unduly increased due to undesired passage through "0" of output Do1 between two read cycles of a "1". Furthermore, the current consumption increases with the length of the lines on which these signals transit. Thus, the current consumption becomes significantly high if the output of a first dual-port memory is connected to the inputs of a plurality of additional dual-port memories.

SUMMARY OF THE INVENTION

An object of the invention is to provide a dual-port memory structure having a particularly low current consumption.

Another object of the invention is to provide a FIFO memory having a particularly low current consumption and a particularly simple structure.

These and other objects are achieved with a dual-port memory including dual-port memory cells disposed in columns. One output line per column is connected to each cell of the column through a read transistor that is controlled by a respective read line. Precharge transistors connect the output lines to a precharge voltage corresponding to a first logic state, these transistors being turned on by the inactive state of a read selection signal. Output transistors connect the output lines to a memory output. A dummy memory cell is associated with a dummy output line and with a precharge transistor; the output of this dummy cell is at a second logic state opposite to the first logic state. A dummy read transistor is turned on by the active state of the read selection signal and connects the output of the dummy cell to the dummy output line. Means are provided for turning on the output transistors when the state of the dummy output line reaches a predetermined threshold between the first and second logic states.

According to an embodiment of the invention, one input line per column is connected to each cell of the column through a write transistor controlled by a respective write line. For each write line, the memory includes a transistor that connects this write line to a memory input and is turned on by the active state of a write selection signal.

According to an embodiment of the invention, the means for turning on the output transistors include a logic gate having a first input connected to the dummy output line through an inverter and a second input that receives the read selection signal.

According to an embodiment of the invention, the dummy cell includes a conducting transistor that is connected to a fixed voltage corresponding to the second logic state.

According to an embodiment of the invention, the memory is a first-in/first-out (FIFO) memory that includes a first circular shift register whose outputs respectively control the read lines, the shifting of this register being controlled by the complement of the read selection signal; and a second circular shift register whose outputs respectively control the write lines, the shifting of this register being controlled by the complement of the write selection signal.

The foregoing and other objects, features, aspects and advantages of the invention will become apparent from the following detailed description of the present invention when taken in conjunction with the accompanying drawings.

DETAILED DESCRIPTION

Figure 1:
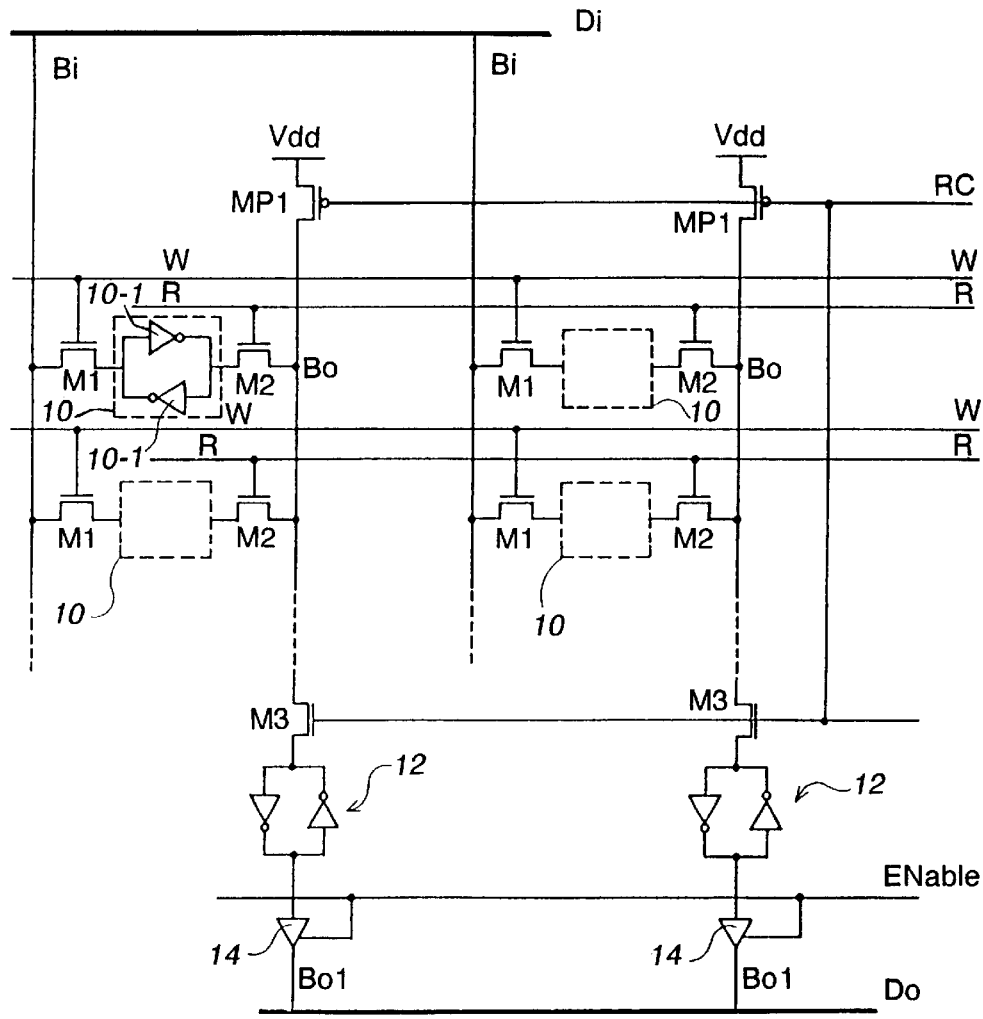
FIG. 1, above described, partially represents a conventional dual-port memory structure.
Figure 3:
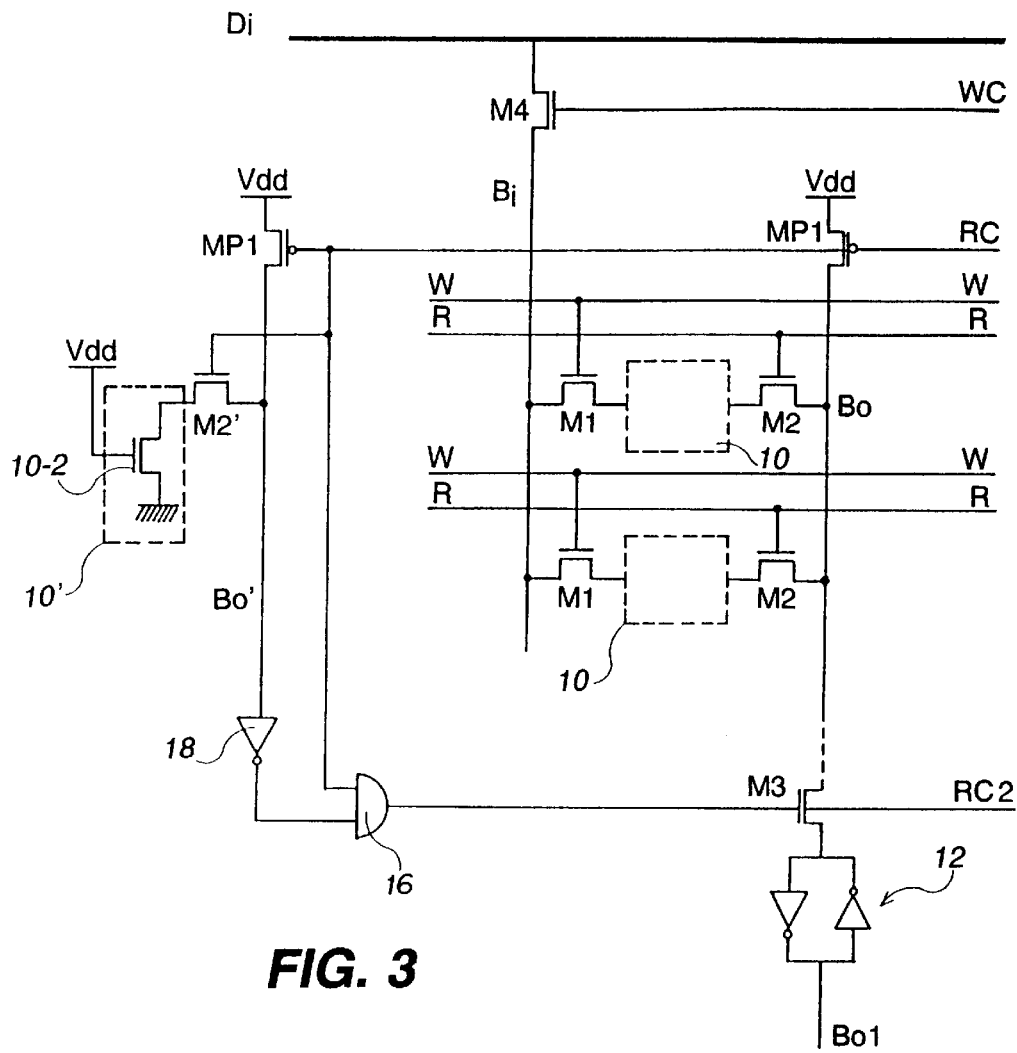
Fig. 3 partially represents an embodiment of a dual-port memory structure according to the invention.

In FIG. 3, same elements as in FIG. 1 are labeled with same reference numerals.

The invention provides a dummy memory cell 10' for all of the columns of cells; the output of this dummy cell is connected to a dummy output line Bo' through an N-channel MOS transistor M2'. The output of this dummy cell 10' is constantly forced to "0" through an N-channel MOS transistor 10-2 that is connected between transistor M2' and ground, and whose gate is connected to voltage Vdd. Transistors M2' and 10-2 are selected so as to have the same characteristics, respectively, as transistors M2 and the N-channel output transistor of a memory cell.

The dummy output line Bo' is connected to voltage Vdd, as the other output lines Bo, by a precharge transistor MP1 whose gate is controlled by the read-column signal RC. In contrast to the read transistors M2, the gate of the read transistor M2' of the dummy cell is connected to line RC. With this configuration, the dummy cell 10' is "read" simultaneously with any one of the other "real" cells, and the dummy output line Bo' behaves exactly in the same way as line Bo of the real cell that is read.

The gates of the output transistors M3, instead of being connected to line RC, are connected to a line RC2 that is connected to the output of an AND gate 16. A first input of the AND gate 16 is connected to line RC and the second input is connected to the dummy output line Bo' through an inverter 18.

Figure 2:
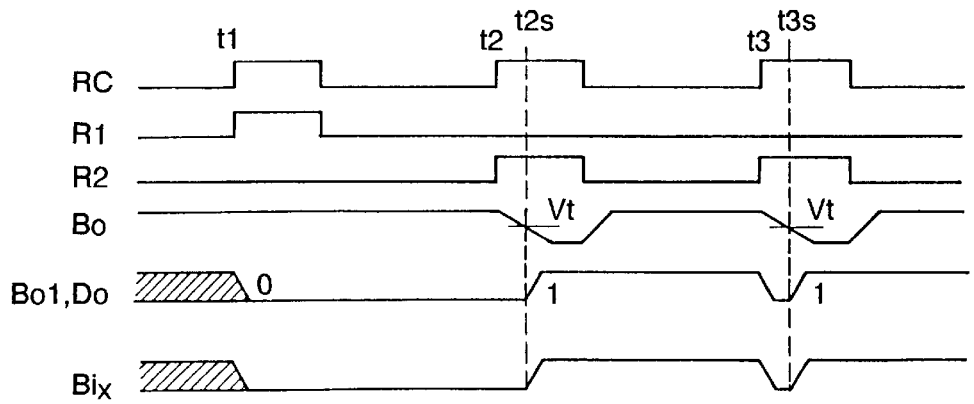
FIG. 2 represents the waveform of various signals of the memory of FIG. 1 during read cycles.
Figure 4:
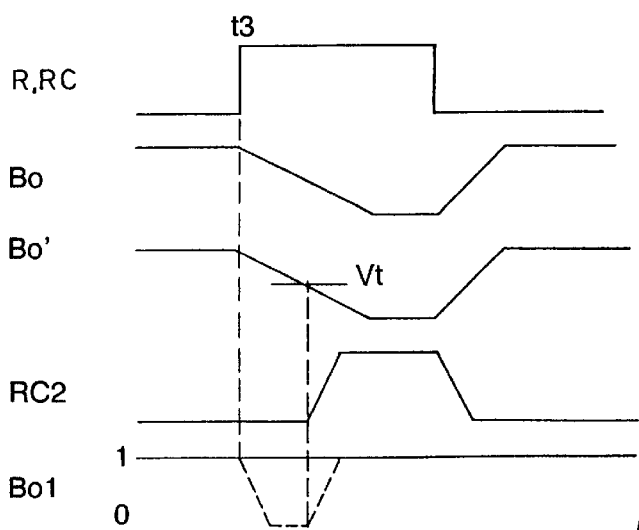
FIG. 4 represents the waveforms of various signals of the memory of FIG. 3 during a read cycle.

FIG. 4 shows the waveforms of various signals of the memory of FIG. 3 during the read cycle of a "1" in a memory cell whereas a "1" was previously read in a cell of the same column. This case corresponds to time t3 of FIG. 2 where the output of a conventional memory undesirably passed through "0".

At time t3, lines R and RC are asserted. The precharge transistors MP1 are off; transistor M2' and transistor M2 of the cell to be read turn on. The output of the dummy cell 10' and the output of cell 10 to be read are at "0", which causes, as shown, the output lines Bo and Bo' to be progressively and synchronously discharged. During a first discharge phase of line Bo', the threshold voltage Vt of inverter 18 is not reached; the output of gate 16 remains at "0" and the output transistors M3 remain off. This first phase corresponds to the time interval during which the output of a conventional memory undesirably passes through "0", as represented in dotted lines for the output Bo1 . This undesirable passage through "0" is avoided, according to the invention, due to the fact that the output transistors M3 remain off during this first phase.

When the state of the dummy output line Bo' reaches the threshold voltage Vt, the output of inverter 18 switches to "1". The two inputs of gate 16 are then at "1", which causes line RC2 to be asserted. The output transistors M3 turn on, but since the state of line Bo (that varies as that of line Bo') is below the threshold voltage Vt, latch 12 (whose input was at "0") does not switch. Hence, output Bo1 continuously remains at "1".

When lines R and RC are disabled, line RC2 is immediately disabled, and lines Bo and Bo' are again charged to voltage Vdd.

With this configuration, two transitions, corresponding to a short undesired passage through "0", of each memory output during two consecutive read cycles of a "1", are avoided. Of course, the addition of a dummy cell 10' and of a dummy output line Bo' increases current consumption. This current consumption is however low as compared with the consumption caused by one undesired passage through "0" at a memory output, because the memory outputs are connected to lines having a significant length.

According to an embodiment of the invention, each input line Bi is connected to the memory input through an N-channel MOS transistor M4. The gates of transistors M4 are connected to a write-column line WC. As indicated above, line WC is a line that serves to select the write mode of the memory. Line WC is asserted simultaneously with any of the write lines W.

With this configuration, as long as the write mode of the memory is not selected, the input lines Bi are disconnected from bus Di and therefore do not cause an increase in the line capacity of bus Di.

Figure 5:
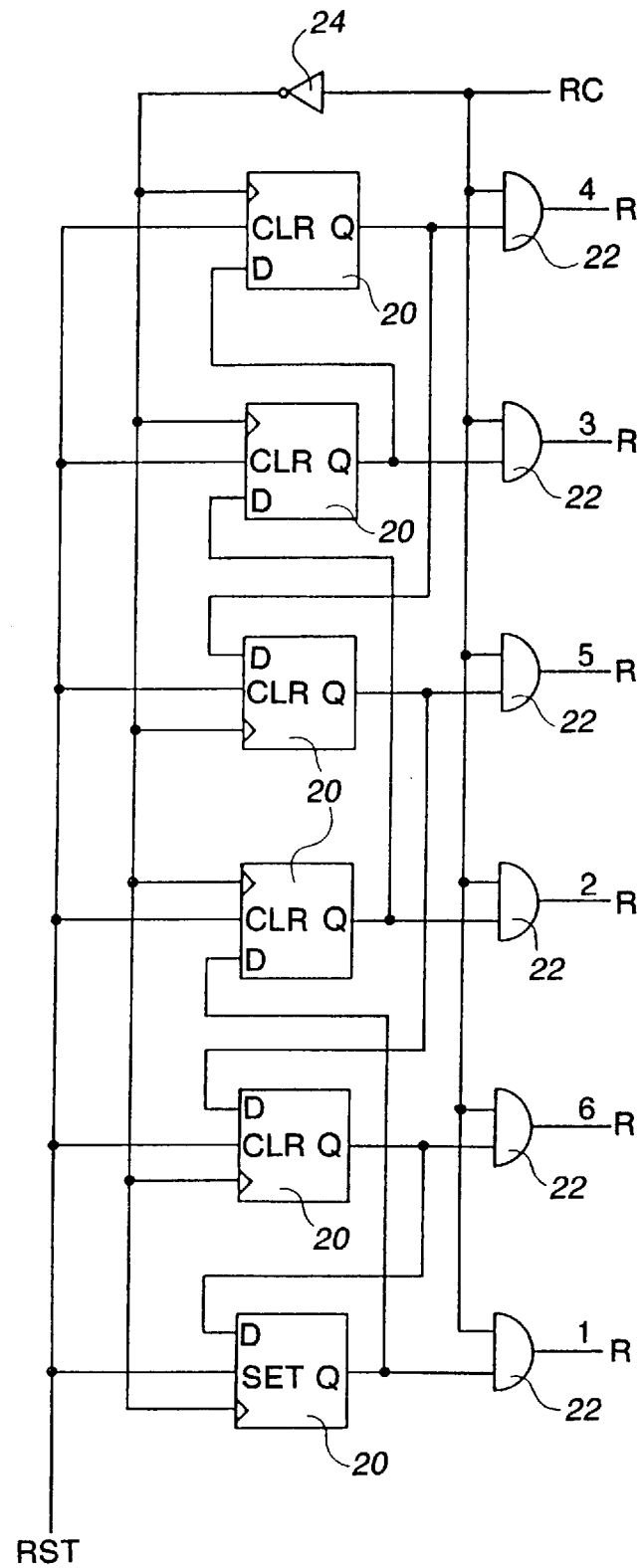
FIG. 5 represents an embodiment according to the invention of a control circuit for controlling the read and write lines of a FIFO memory.

Fig. 5 represents an embodiment of a control circuit of the write lines W and read lines R, which allows, in combination with a dual-port memory, the construction of a particularly simple FIFO memory. FIG. 5 illustrates an example in which six read lines R and six write lines W are provided. A circuit as the one of FIG. 5 is associated with the six read Lines R, and a second identical circuit is associated with the six write lines W. Only the control circuit associated with the read lines is described hereinafter.

The control circuit includes a shift register containing six cascaded flip-flops 20, that is, the output of each flip-flop is connected to the input of the next flip-flop. Each output of a flip-flop 20 is provided to one of the read lines R through an AND gate 22. A second input of the AND gates 22 is connected to a read-column line RC that is also connected to the clock inputs of flip flops 20 through an inverter 24. A reset signal RST is provided to each flip-flop 20. The assertion of signal RST sets the first flip-flop 20 to "1" and sets the remaining flip-flops to "0". The shift register is circularly connected, that is, the output of the last flip-flop is connected to the input of the first flip-flop. As shown, flip-flops 20 are interleaved, that is, the last (6th) flip-flop is disposed between the first and second flip-flops; the before-last (5th) flip-flop is disposed between the second and third flip-flops, and so on. With this organization, all the connections between the flip-flops have substantially the same length, regardless of the number of flip-flops, thus preventing the flip-flops from having dissimilar switching times.

Initially, the assertion of signal RST causes the first flip-flop to be at "1" and the remaining flip-flops to be at "0". When line RC is asserted, the read mode of the first row of cells is selected. When line RC is disabled, the "1" that was in the first flip-flop 20 is shifted to the second flip-flop. At the next assertion of line RC, the read mode of the second row of cells is selected. When the "1" reaches the last flip-flop (6), it returns to the first flip-flop as soon as signal RC is disabled.

A control circuit identical to the one of FIG. 5 is also associated with the write lines W. The write lines W are connected to the outputs of the AND gates 22, and the write-column line WC is connected to the input of inverter 24. Of course, the order of the flip-flops can be changed if it is desired to read the stored data in an order different from their writing order.

Thus, a particularly simple FIFO structure is provided, because the rows of cells are directly selected through the shift registers without using the conventional complex system required to generate addresses and to decode these addresses.

Of course, the devices for writing or reading in the FIFO memory must be capable of determining its state. To achieve this purpose, these devices need a signal FULL indicating that the memory is full and also, if required, a signal ½FULL indicating that the memory is half full.

Figure 6:
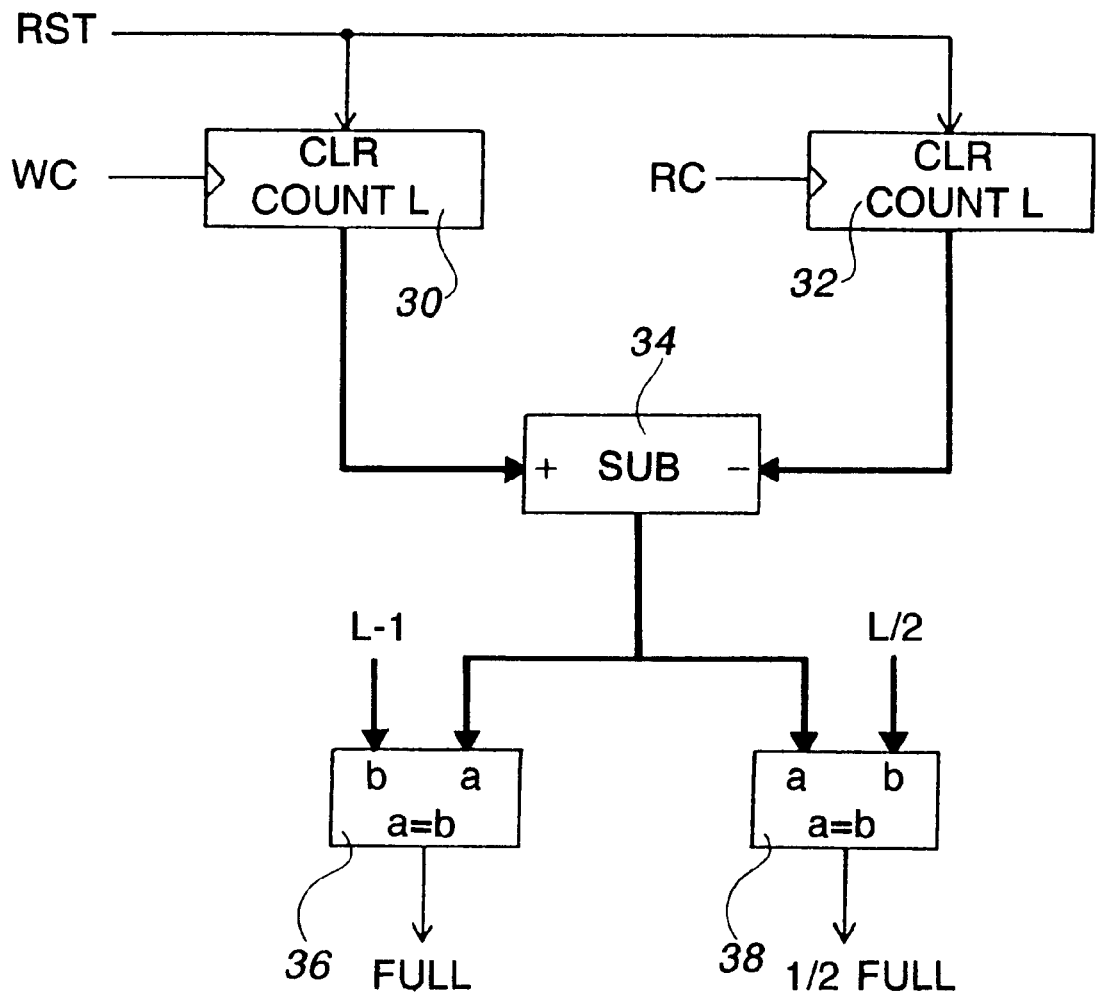
FIG. 6 represents an exemplary circuit for generating state signals of a FIFO memory provided with the control circuit of FIG. 5.

FIG. 6 schematically represents a circuit for providing such signals FULL and ½FULL.

This circuit includes two divide-by-L counters 30 and 32, L being the number of words of the FIFO memory (6 in the example of FIG. 5). Counter 30 is enabled by the write-column line WC; counter 32 is enabled by the read-column line RC. Both counters 30 and 32 are reset by signal RST. The outputs of counters 30 and 32 are provided to a digital subtracter 34 that provides the difference between the content of counter 30 and the content of counter 32 (that is, the difference between the number of data written and the number of data read). The output of subtracter 34 is provided to an input a of two comparators 36 and 38. An input b of comparator 36 receives number L-1, and an input b of comparator 38 receives number L/2. The comparator 36 asserts the full state signal FULL when the result of the subtraction in subtracter 34 is equal to L-1, and comparator 38 asserts the half-full state signal ½FULL when the result of the subtraction is equal to L/2.

Various alternatives of the present invention will appear to those skilled in the art, for example in choosing the polarities of the signals and correspondingly adaptating the various circuits.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A dual-port memory, comprising:

a plurality of dual-port memory cells disposed in a plurality of columns;

one input line per column connected to each memory cell of the column through a write transistor that is turned on by a respective write line; and for each input line, an input transistor directly connected between the input line and a respective line of a data bus, each input transistor connected to a write-column line;

wherein the input transistors are all turned on at a same time by the write-column line which is simultaneously actuated when any one of the write lines is at an active state.

2. The dual-port memory of claim 1, further comprising:

one output line per column connected to each cell of the column by a read transistor that is controlled by a respective read line;

precharge transistors connecting the output lines to a precharge voltage corresponding to a first logic state, the precharge transistors being turned on by an inactive state of a read selection signal;

output transistors connecting the output lines to a memory output;

a dummy memory cell associated with a dummy output line and with a precharge transistor, an output of said dummy memory cell being at a second logic state opposite to said first logic state;

a dummy read transistor turned on by an active state of the read selection signal and connected to the dummy output line; and means for turning on said output transistors when a state of the dummy output line reaches a predetermined threshold between the first and second logic states.

3. The dual-port memory of claim 2, wherein said means for turning on the output transistors include a logic gate having a first input connected to the dummy output line through an inverter and a second input that receives the read selection signal.

4. The dual-port memory of claim 2, wherein said dummy memory cell includes a conducting transistor connected to a fixed voltage corresponding to the second logic state.

5. A circuit for controlling a write cycle of a memory device, the memory device having input column lines, at least one memory cell coupled to each input column line, a plurality of data lines, and at least one write line that is respectively coupled to the at least one memory cell, the controlling circuit including a plurality of input transistors, each input transistor having a first terminal respectively connected to one of the plurality of data lines, a second terminal respectively coupled to one of the input column lines, and a third terminal coupled to a write-column line;

wherein the input transistors are all simultaneously activated by the write-column line which is simultaneously activated when any one of the at least one write line is activated.

6. A circuit for controlling a write cycle of a memory device, the memory device having input column lines, at least one memory cell coupled to each input column line, at least one write line that is respectively coupled to the at least one memory cell, and a plurality of data lines, the circuit comprising:

a write-column line, coupled to each of the at least one write line, the write-column line being simultaneously activated when any one of the at least one write line is activated; and means, connected between the input column lines, and the data lines, for simultaneously decoupling each of the plurality of data lines from each of the respective input column lines whenever the write-column line is not activated.

7. A memory device, comprising:

input column lines;

at least one memory cell coupled to each input column line;

a plurality of data lines;

at least one write line that is respectively coupled to the at least one memory cell; and a plurality of input transistors, each input transistor having a first terminal connected to a respective one of the plurality of data lines, a second terminal coupled to a respective one of the input column lines, and a third terminal coupled to a write-column line;

wherein the input transistors are all simultaneously activated by the write-column line which is simultaneously activated when any one of the at least one write line is activated.

\* \* \* \* \*